US006157261A

United States Patent [19]

Audoin et al.

[11] Patent Number: 6,157,261

[45] Date of Patent: Dec. 5, 2000

[54] METHOD OF CONTROLLING THE AMPLITUDE OF THE MICROWAVE SIGNAL APPLIED TO AN ATOMIC CLOCK AND FOLLOW-UP INTERLOCKING DEVICE FOR CARRYING OUT THIS METHOD

[75] Inventors: Claude Audoin, Chatenay-Malabry; Frédéric Hamouda, Savigny sur Orge; Luc Chassagne, Paris; Roland Barillet, Gif sur Yvette, all of France

[73] Assignee: Tekelec Temex, Sevres, France

[21] Appl. No.: 09/181,217

[22] Filed: Oct. 29, 1998

[30] Foreign Application Priority Data

Oct. 29, 1997 [FR] France ..................................... 97 13572

[51] Int. Cl.[7] .............................. H03L 7/26; H03B 17/00; H01S 1/06

[52] U.S. Cl. .............................................. 331/3; 331/94.1

[58] Field of Search ........................................ 331/3, 94.1

[56] References Cited

U.S. PATENT DOCUMENTS 4,331,933 5/1982 Allan et al. ................................ 331/3
4,684,900 8/1987 Avila et al. ................................ 331/3
4,943,955 7/1990 Rabian et al. ........................... 368/156

FOREIGN PATENT DOCUMENTS 0 526 073 2/1993 European Pat. Off. .

*Primary Examiner*—David Mis
*Attorney, Agent, or Firm*—Pennie & Edmonds LLP

[57] ABSTRACT

A method of controlling the amplitude of the microwave signal applied to an atomic clock comprising an atomic resonator and a device for interlocking an ultra-stable oscillator in follow-up relationship with the atomic resonance, adapted to produce the signal from which the microwave signal is derived, the method consisting in transforming the amplitude of the microwave signal before its application to the atomic jet resonator according to a law such that the shape of the curve of atomic response versus the amplitude of the microwave signal be symmetrical over a wide extent about the vertical line passing through the maximum of the response.

7 Claims, 2 Drawing Sheets

P $V_t - \Delta V$ $V_t$ $V_t + \Delta V$ V 17
18
a
TM
N.TM
2 .TM
5
b
15
+ Δ m
c
(N+2) TM
- Δ m

S
P
.1.
2
.14.
15
13
.9.
10
.7.
6
.4.
11
.3.
8
5

METHOD OF CONTROLLING THE AMPLITUDE OF THE MICROWAVE SIGNAL APPLIED TO AN ATOMIC CLOCK AND FOLLOW-UP INTERLOCKING DEVICE FOR CARRYING OUT THIS METHOD

TECHNICAL FIELD

The invention relates to a method of controlling the amplitude of the microwave signal applied to an atomic clock of the type comprising an atomic resonator and a device for interlocking an ultra-stable or stable local oscillator in follow-up relationship with the atomic resonance, adapted to produce the signal from which the said microwave signal is derived and a follow-up interlocking device for carrying out this method.

BACKGROUND ART

A method and a device of this type are already known.

It is known that, when the frequency of the microwave signal applied to the atomic resonator is equal to $f_o \pm f_m$ ($f_o$ being the frequency of the atomic resonance), the response of the resonator exhibits extremums when the amplitude of the microwave signal is varied, thereby permitting to interlock the amplitude of the microwave signal in follow-up relationship with a value which only depends on the properties of the resonator, which are nearly insensitive to ambient disturbances such for example as the temperature. It is the most marked extremum, the first maximum in this case, which is advantageously used.

Now in the case of a caesium jet clock, the atomic response is not symmetrical with respect to a vertical line passing through the maximum when the abscissa is proportional to the amplitude of the signal. In this case, the maximum may be obtained with a good accuracy only if the depth of the modulation of the microwave amplitude is small. The error signal which permits to control the value of the amplitude is then obtained with a small signal-to-noise ratio, thereby imposing a permanent modulation of the amplitude.

Therefore the known methods and devices, of the kind stated hereinabove, carry out a not very marked modulation of the amplitude of the microwave signal which is applied permanently. This technical process exhibits the inconvenience that the amplitude modulation and the frequency modulation are intermingled with each other, thereby providing very complex if not too complex conditions in particular in the case of a caesium jet clock with an optical pumping.

SUMMARY OF THE INVENTION

The present invention provides a method and a device of the type referred to hereinabove, which cope with the inconveniencies of the state of the art.

To reach this goal, the method according to the invention is characterized in that it consists in transforming the amplitude of the microwave signal, prior to its application to the atomic jet resonator, according to a law such that the shape of the atomic response curve versus the transformed amplitude be symmetrical over a wide extent about the vertical line passing through the maximum of the response.

According to a characterizing feature of the invention, the modulation of the amplitude of the microwave signal applied to the resonator is deep, whereby the modulation depth may reach up to a few dB from the median value.

According to another characterizing feature of the invention, the modulation is applied discontinuously, the choice of the time interval between two successive adjustments of the amplitude of the microwave signal being guided by the inertia of the atomic clock with respect to the disturbances of its environment.

According to still another characterizing feature, with a resonator with an optical pumping, the transformation law is a logarithmic law.

BRIEF DESCRIPTION OF THE DRAWINGS

The invention will be better understood and further objects, characterizing features, details and advantages thereof will appear more clearly as the following explanatory description proceeds with reference to the attached diagrammatic drawings given by way of non limiting example only illustrating an embodiment of the invention and in which.

DETAILED DESCRIPTION OF THE PREFERRED EMBODIMENTS

The invention will be described hereinafter in its application to an atomic clock comprising a caesium jet resonator with an optical pumping. This application is however described by way of example only and is not limiting.

Figure 5:
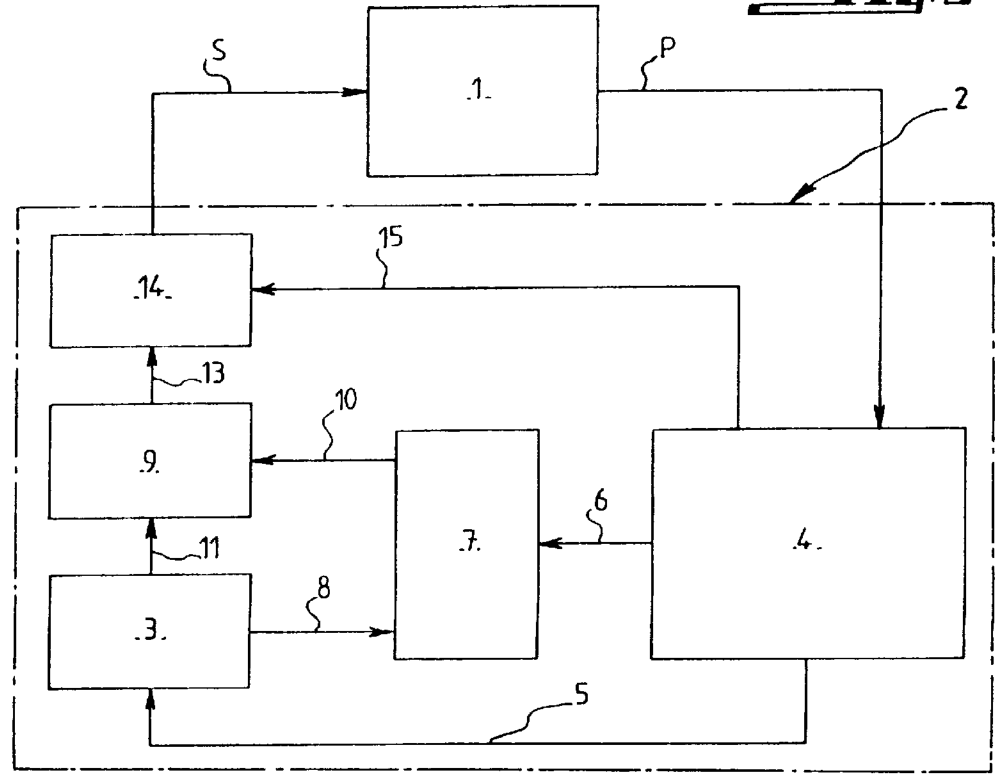
FIG. 5 illustrates the structure of an atomic clock provided with a follow-up interlocking device according to the present invention.

Referring to FIG. 5, one sees that an atomic clock comprises an atomic resonator designated at 1 and an "electronic" device 2 intended to interlock an ultra-stable or stable local oscillator 3 in follow-up relationship with the atomic resonance. Since the structure of the resonator does not form part of the invention, it will not be described here but its description is disclosed in the French patent n° 2,688,632 belonging to the applicant.

Figure 1:
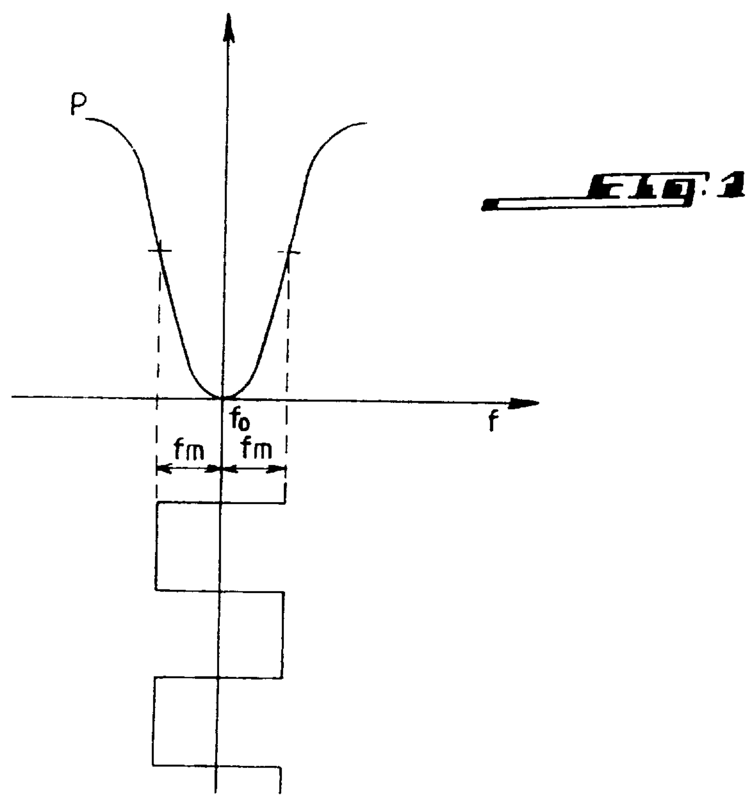
FIG. 1 shows a diagram of the response of an atomic jet resonator versus the frequency of the microwave signal applied to the resonator, about the resonance frequency, the phase difference or shift between both oscillating fields being equal to $\pi$ in this example.

In order to interlock the oscillator 3 in follow-up relationship, a microwave signal S of which the frequency f varies periodically is applied to the resonator 1. Under established operating conditions, the applied frequency is equal to $f_o - f_m$ for one half modulation period and $f_o + f_m$ during the following half-period as illustrated by FIG. 1. The value of $f_m$ is close to the half-width of the atomic resonance. The frequency $f_o$ is equal to the atomic resonance frequency and it is found that the response of the resonator is the same at $f_o - f_m$ and at $f_o + f_m$. The frequency of the ultra-stable or stable local oscillator 3 is interlocked in follow-up relationship accordingly.

Figure 2:
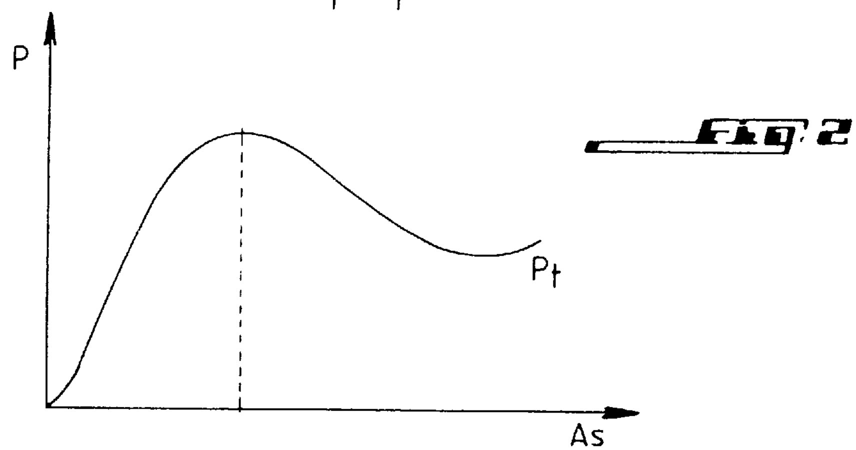
FIG. 2 shows the diagramme of the response of the resonator versus the amplitude of the signal applied to the resonator.

It is known that when the frequency of the applied microwave signal S is equal to $f_o \pm f_m$, the response of the resonator 1 exhibits extremums when the amplitude of the microwave signal varies. FIG. 2 thus shows that the atomic response curve P is not symmetrical with respect to a vertical line passing through the maximum when the abscissa is proportional to the amplitude of the microwave signal As. In this case, the maximum may be obtained with a good accuracy only if the depth of the modulation of the microwave amplitude is small. The method of interlocking in follow-up relationship performed for that purpose is similar in its principle to that shown on FIG. 3 by replacing the frequency value with the amplitude value. This method is used in the state of the art as explained hereinabove. Now in this case, the error signal which permits to control the amplitude value is obtained with a small signal-to-noise ratio only, thereby therefore imposing a permanent modulation of the amplitude.

Figure 3:
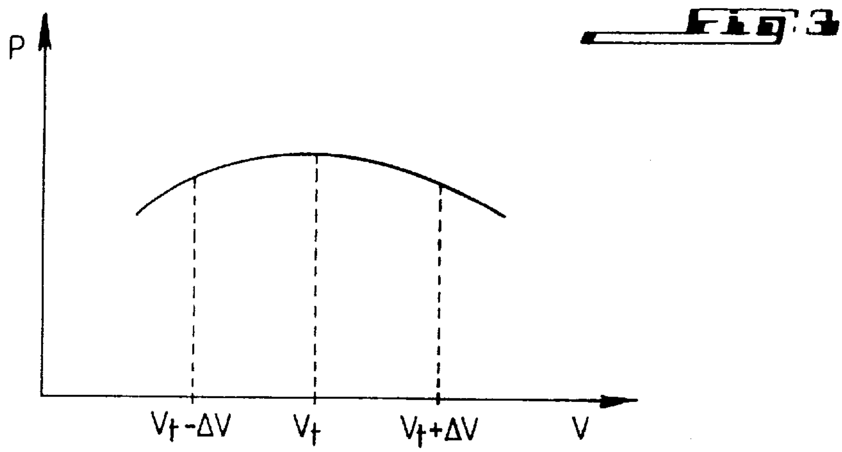
FIG. 3 shows the diagramme of the response of the resonator versus the logarithm of the amplitude of the microwave signal.

An aspect of primary importance of the present invention is based upon the discovery that in a diagramme where the abscissa is proportional to the logarithm of the amplitude of the microwave signal, the variation of the atomic response P becomes symmetrical over a broad extent of from 1 to 3 dB for example about the vertical line passing through the maximum $P_o$ at the value $V_t$ of the voltage controlling the amplitude in such a manner that a diagramme where the abscissa as illustrated by FIG. 3 is obtained. Owing to this symmetry, the modulation of the amplitude may then be deep and the depth may extend down to a few dB as this has just been stated. The signal-to-noise ratio then becomes very satisfactory and the modulation may be applied in a discontinuous manner. The choice of the time interval between two successive adjustments of the microwave amplitude is selected in accordance with the inertia of the whole clock with respect to the disturbances of its environment. To provide the symmetry according to FIG. 3, a microwave signal S of which the amplitude is an exponential function of the control voltage 15 produced by the unit 4 is applied to the resonator.

As further explained with reference to FIG. 4, the time intervals during which the interlocking in follow-up relationship of the frequency of the oscillator 3 is activated are alternated with shorter time intervals during which the interlocking of the amplitude in follow-up relationship is carried out. The control voltages of the frequency of the oscillator and of the amplitude of the microwave signal are blocked during those time intervals where the corresponding interlockings in follow-up relationship are inoperative.

The interlocking in follow-up relationship of the amplitude of the microwave level stabilizes the frequency displacements or shifts of which the value depends on this level (for example: Doppler effect of the second order or effect of a residual difference or deviation with respect to the value 0 or $\pi$ of the phase shift between two oscillating fields to which the caesium atoms are subjected in the atomic resonator).

Now there exists a value of the microwave amplitude such that when there is a small unbalance between the values of this amplitude associated with $f_o-f_m$ on the one hand and with $f_o+f_m$ on the other hand, no error on the fixed point of the frequency of the atomic resonance results therefrom. Such an unbalance may originate from a defectiveness of the generation and of the transmission of the microwave signal or from a detuning of the resonant cavity, i.e. when the tuning frequency of the cavity is different from the frequency of the atomic resonance. In this latter case at an identical input level of the microwave signal at the frequencies $f_o-f_m$ and $f_o+f_m$, there corresponds a different amplitude of the field in the cavity—and therefore interacting with the atoms—at both applied frequencies $f_o\pm f_m$.

The microwave amplitude which suppresses these two frequency displacements or shifts is the one which corresponds to an extremum of the atomic response when the applied frequency is equal to $f_o\pm f_m$.

Referring to FIG. 5, the follow-up interlocking device which permits to carry out the method according to the invention which has just been described with reference to FIGS. 1 to 3 will be described hereinafter.

It is seen that the response $P_t$ is applied to one acquisition, calculation and control unit denoted at 4, which on the one hand controls the frequency of the ultra-stable or stable local oscillator 3 at 5 and produces an adjustable frequency control signal 6 to be provided to an adjustable frequency synthesis unit 7. The latter is connected at 8 to the oscillator 3 and operates a microwave synthesis unit 9 at 10, this unit 9 receiving at 11 the signal produced by the oscillator 3. The unit 9 is connected at 13 to an adjustable gain unit 14 which also carries out the operation for symmetrizing the response curve of the resonator by consequently converting the amplitude of the microwave signal coming from the synthesis unit 9 which constitutes the signal S applied to the resonator 1. In this present example, the amplitude of the microwave signal is an exponential function of the control voltage 15. For the adjustment of the gain, the unit 4 sends at 15 an amplitude control signal to the unit 14.

Figure 4:
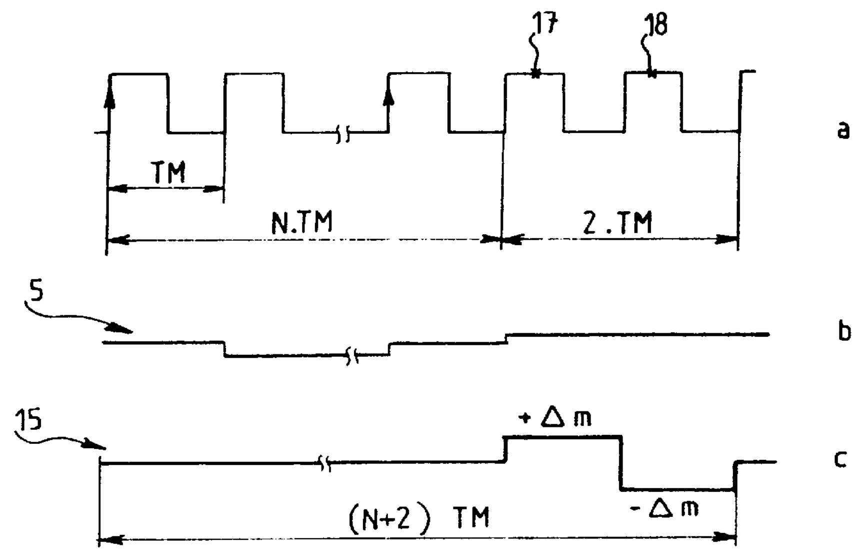
FIG. 4 shows the chronogramme of the successive follow-up interlocking of the frequency of the ultrastable or stable local oscillator and of the amplitude of the microwave signal.

The operation of the follow-up interlocking device 2 appears from the diagramme shown on FIG. 4.

This figure shows at a the square modulation of the frequency of the microwave signal. The frequency modulation is permanently applied and each follow-up interlocking occupies a whole number of modulation periods TM. According to FIG. 4*c*, the control voltage of the frequency of the ultra-stable or stable local oscillator 3 insuring the interlocking of the latter in follow-up relationship with a frequency of the resonator, occupies N periods TM during which the voltage is fluctuating. This follow-up interlocking interval of the oscillator is followed by an interval of two periods TM for the follow-up interlocking of the amplitude, with an acquisition at the levels corresponding to the control voltages $V_t+\Delta V$ and $V_t-\Delta V$ for example at 17 and 18. FIG. 4 shows at c the curve of the microwave power control voltage and it is seen that this control voltage is increased by $+\Delta m$ and $-\Delta m$ during the amplitude follow-up interlocking interval whereas it is constant for the duration of the frequency follow-up interlocking.

The present invention has just been described in its application to a caesium jet resonator with optical pumping. It is obvious that the invention is applicable to other cases and the symmetrization may then require a law different from the logarithmic law of the present example.

EXAMPLES

A certain number of devices of the field of application of the invention will now be shown also by way of non limiting examples:

Any atomic (caesium, rubidium, etc), ionic (mercury ion, etc) or molecular species which may give rise to the provision of a frequency standard or of a device exploiting the methods of observations stated hereinafter. For the sake of simplicity, the atoms or ions or molecules used will be called "atoms".

In general any frequency standard or device where the response of the "atoms" exhibits an extremum when the applied frequency is equal to the resonance frequency of the "atoms" plus or minus a shift equal as an order of magnitude to the half-width of the resonance of the "atoms". This resonance may be due to an excitation in any portion whatsoever of the electromagnetic (microwave or optical for example) spectrum.

Frequency standard or device using a continuous or discontinuous flux of "atoms", in which the interaction between the "atoms" and the electromagnetic radiation is effected in one single region of the space (Rabi method and its alternative embodiments) or in two (Ramsey method and its alternative embodiments) or several disjoined zones distributed along the path of travel of the "atoms". In these devices, the succession of the interactions results from the movement of the "atoms". Three examples of these devices are the following: a) clock with caesium atoms originating continuously from a furnace at a temperature close to the ambient temperature (about 80 to 100° C.), b) clock with caesium atoms cooled by laser irradiation, falling continuously or in packets under the effect of gravity and interacting with the microwave field in one, two or several zones, c) fountain with caesium atoms cooled by laser irradiation, wherein the atoms are thrown upwards and follow a ballistic path of travel and wherein the interaction with the microwave field occurs twice in one single zone of the space: one time during the upwards path of travel of the atoms and the other time during their downward path of travel.

Frequency standard or device with a cell for catching the "atoms", whatever the physical origin of the catching may be: physical wall, electric and/or magnetic field, interaction with light waves in association or without association with a magnetic field.

Frequency standard or devices in which the interaction with the signal of electromagnetic excitation of the resonance is effected in one single zone but in which a temporal cutting out of the excitation signal insures the desired succession of the interactions leading to the observation of the resonance of the "atoms".

What is claimed is:

1. A method of control of the amplitude of the microwave signal applied to an atomic clock of the type comprising an atomic resonator and a device for interlocking an ultra-stable or stable local oscillator in follow-up relationship with the atomic resonance, adapted to produce the signal from which the microwave signal is derived, wherein the improvement consists in transforming the amplitude of the microwave signal (S) prior to its application to the atomic jet resonator (1) according to such a law that the shape of the curve ($P_t$) of atomic response versus the amplitude of the microwave signal (S) is symmetrical over a broad extent about the vertical line passing through the maximum of the response.

2. A method according to claim 1, wherein the modulation of the amplitude of the microwave signal (S) applied to the resonator (1) is deep and the modulation depth may extend down to a few dB about the median value.

3. A method according to claim 1, wherein the modulation is applied in a discontinuous manner, the choice of the time interval between two successive adjustments of the amplitude of the microwave signal being guided by the inertia of the atomic clock with respect to the disturbances of its environment.

4. A method according to claim 1, for a resonator with optical pumping, wherein the law of transformation is a logarithmic law.

5. A follow-up interlocking device for carrying out the method according to claim 1, comprising an ultra-stable or stable local oscillator (3) and an acquisition, calculation and control unit (4) intended to produce control signals (5, 15) for the interlocking of the microwave signal in follow-up relationship with the atomic resonance from the response ($P_t$) of the resonator, wherein the improvement consists in that it comprises means (14) for transforming the amplitude of the microwave signal directly derived from the ultrastable oscillator (3) in order that the curve of the response ($P_t$) of the resonator be symmetrical in accordance with the amplitude of the microwave signal over a wide extent about the vertical line passing through the maximum of the response.

6. A device according to claim 5, comprising adjustable gain means (14) under the control of the acquisition, calculation and control unit (4) for the correction of an error originating from the presence of side resonance lines which are framing the atomic resonance line serving as a reference to the atomic clock.

7. A device according to claim 5, wherein the aforesaid transformation means comprise a PIN diode in the case of a caesium jet resonator with optical pumping.

* * * * *